United States Patent
Schweizer (10) Patent No.: US 6,184,490 B1
(45) Date of Patent: Feb. 6, 2001

(54) MATERIAL IRRADIATION APPARATUS WITH A BEAM SOURCE THAT PRODUCES A PROCESSING BEAM FOR A WORKPIECE, AND A PROCESS FOR OPERATION THEREOF

(75) Inventor: Jürgen Schweizer, Westhausen (DE)

(73) Assignee: Carl-Zeiss-Stiftung (DE)

(*) Notice: Under 35 U.S.C. 154(b), the term of this patent shall be extended for 0 days.

(21) Appl. No.: 08/930,436
(22) PCT Filed: Apr. 9, 1997
(86) PCT No.: PCT/EP97/01748
§ 371 Date: Sep. 27, 1997
§ 102(e) Date: Sep. 27, 1997
(87) PCT Pub. No.: WO97/37807
PCT Pub. Date: Oct. 16, 1997

(30) Foreign Application Priority Data

Apr. 9, 1996 (DE) ............................................. 196 14 050

(51) Int. Cl.⁷ .......................... B23K 26/067; G02B 27/14
(52) U.S. Cl. .............................. 219/121.77; 219/121.74; 359/629
(58) Field of Search .................... 219/121.77, 121.67, 219/121.74; 359/629, 631, 638, 639, 640

(56) References Cited

U.S. PATENT DOCUMENTS

| | | | |
|---|---|---|---|
| 4,315,130 | * 2/1982 | Inagaki et al. | 219/121.77 |
| 4,701,591 | * 10/1987 | Masaki et al. | 219/121.77 |
| 5,237,149 | * 8/1993 | Macken | 219/121.73 |
| 5,290,992 | * 3/1994 | Lin et al. | 219/121.74 |
| 5,302,798 | * 4/1994 | Inagawa et al. | 219/121.77 |
| 5,325,381 | * 6/1994 | Paoli | 359/629 |
| 5,674,414 | * 10/1997 | Schweizer | 219/121.77 |
| 5,676,866 | * 10/1997 | in den Bäumen et al. | 219/121.77 |
| 5,731,047 | * 3/1998 | Noddin | 219/121.7 |
| 5,798,867 | * 8/1998 | Uchida et al. | 359/629 |
| 5,948,291 | * 9/1999 | Neylan et al. | 219/121.77 |

FOREIGN PATENT DOCUMENTS

| | | | |
|---|---|---|---|
| 683007 | * 11/1995 | (EP) | . |
| 52-28095 | * 3/1977 | (JP) | 219/121.77 |
| 58-35090 | * 3/1983 | (JP) | 219/121.77 |
| 1-210190 | * 8/1989 | (JP) | 219/121.74 |
| 1-233086 | * 9/1989 | (JP) | 219/121.74 |
| 3-184687 | * 8/1991 | (JP) | 219/121.74 |

* cited by examiner

Primary Examiner—Geoffrey S. Evans (57) ABSTRACT

A material irradiation apparatus with a beam source produces a processing beam. The apparatus has a beam splitting device following the beam source, by which the processing beam is divided into several partial beams. Each partial beam can be deflected by a deflecting device discretely associated with it to different places on at least one workpiece to be processed, independently of the other partial beams. The workpiece to be processed is situated on a workpiece movement device that is movable in at least one axis. The machining beam is successively incident on a plurality of beam splitter devices that are movably arranged in the axis of the machining beam that is incident on them. The partial beams emerging from the beam splitter devices are simultaneously incident on the workpiece movement device. The workpiece movement device is arranged to be movable in at least one coordinate direction that deviates from the movement axis of the beam splitter devices. In a process for the operation of the material irradiation apparatus, the deflecting devices of the partial beams can deflect at least two, preferably at least four, partial beams simultaneously to at least one point on the surface of the workpiece.

33 Claims, 6 Drawing Sheets

FIG. 10 ously deflect a laser beam through respective discrete
MATERIAL IRRADIATION APPARATUS WITH A BEAM SOURCE THAT PRODUCES A PROCESSING BEAM FOR A WORKPIECE, AND A PROCESS FOR OPERATION THEREOF This invention relates to a material irradiation apparatus, and more particularly, to a material irradiation apparatus that produces a processing beam, and to a process for the operation of such material irradiation apparatus.

Such material irradiation apparatus has a beam splitting device that follows the beam source, with which the processing beam is divided into several partial beams. Each partial beam can be deflected by a deflecting device discretely associated with the partial beam, to different places on at least one workpiece to be processed, independently of the other partial beams. The workpiece to be processed is situated on a workpiece movement device that is movable in at least one axis.

DISCUSSION OF RELEVANT PRIOR ART

Irradiation apparatuses for various purposes have been known for a long time, and are known in very varied forms.

In particular, single-beam laser drilling machines are known, which however can only produce one given hole diameter. These apparatuses are relatively slow (one hole at a time) and inflexible (the hole diameter cannot be automatically adjusted, or a larger hole diameter has to be machined out by a trephining process (that is, by the adjoining of many smaller hole diameters).

Multi-spindle guide plate drilling machines on an X-and/or Y-workpiece moving device are also known, the individual drilhng spindles being installed on slides and able to execute separate y-and z-axis movements. A drill change then takes place for individual hole diameters in this mechanical drilling.

A system is known from U.S. Pat. No. 5,268,554 for positioning a laser beam, in which a laser beam is positioned on a workDiece surface. The positioning takes place by means of an adjustable mirror. If it were now desired to work simultaneously at very many places on the workpiece surface, correspondingly many such systems would be required, and mutual spatial interference between them would result Equipment constructed in this manner would also be very complicated.

A system for laser machining is known from Japanese Patent JP 54-102695, in which a predetermined contour is transferred by a laser to another workpiece.

A method for producing a longitudinal strip is known from U.S. Pat. No. 4,670,639, in which a laser beam passes through several splitter mirrors, which respectively deflect the laser beam to different places on the workpiece. The workpiece is then moved in the irradiation axis. The splitter mirrors are set once, and together produce the desired longitudinal strip. This equipment is very inflexible in the disclosed form.

An apparatus for the treatment of workpieces by means of laser energy is known from German Patent DE 20,14,448, in which a laser beam is split by a beam splitter into two separate beams and deflected by deflecting mirrors through a common objective onto a workpiece surface. The use of an objective considerably limits the irradiation surface on the workpiece.

A laser recording equipment is known from U.S. Pat. No. 3,256,524, in which a laser beam is split by beam splitters into several partial beams and is imaged, on a surface to be irradiated, via deflecting rirrors and an objective associated with these.

A laser machining equipment is known from U.S. Pat. No. 4,950,862, in which a laser beam is deflected by means of a mirror through a two iimensional lens array onto a workpiece surface, the workpiece being located on an X-Y table.

A machine for processing many workpiece surfaces with a single laser beam is known from U.S. Pat. No. 4,701,591, the laser beam being divided into several partial beams.

A laser machining equipment is known from U.S. Pat. No. 5,373,137, in which a laser beam is divided by a lens array into many partial beams which are imaged by means of deflecting mirrors and respective discrete optics onto a workpiece surface, where they produce a line pattern.

A laser drilling machine is known from U.S. Pat. Nos. 5,302,798 and 5,113,055, in which deflecting mirrors successively deflect a laser beam through respective discrete objectives onto workpiece surfaces. Machining does not take place in parallel here, but sequentially.

An irradiating device is known from U.S. Pat. No. 5,290,992, in which a laser beam is deflected by beam splitters respectively in different directions in order to be able to machine several workpieces simultaneously.

A single-beam laser drill is known from U.S. Pat. No. 5,063,280, in which the hole production is optimized.

A single beam laser illumination machine is known from U.S. Pat. No. 5,481,407, in which two Fresnel lens arrays assume the task of the objective which is movable in the z-axis; the two arrays are displaced horizontally with respect to each other, in order to obtain the respectively desired focusing of the laser beam.

An irradiating device for the production of three-dimensional objects is known from WO 94/16875, in which a beam is divided into several partial beams, which then fall in common at different places on the object to be produced. No beam shaping takes place here.

The above-described material irradiating equipments of very varied kinds are also particularly used for drilling. In particular, the following possibilities with the laser are available, for the drilling of laminates such as a polyimide foil, 50 $\mu$m thick, which is laminated on both sides with 17 $\mu$m of copper (a starting product in the printed circuit board industry, and today already machined by laser technology), and in which so-called blind holes are to be drilled, passing through the upper copper layer and the polyimide and having the lower copper layer as a floor (see FIG. 1):

In a first process according to the state of the art, the production of the entry holes in the upper copper layer takes place by a phototechnical-chemical method. The polyimide is then removed by laser drilling of the polyimide through the opened copper with an energy density of, e.g., 0.7 J/cm$^2$, which machines the polyimide well but does not attack the copper. The lower copper layer then acts automatically as a stop layer for the laser. The typical laser used here is a pulsed UV laser.

The disadvantage of this process is that apart from the irradiation by means of the laser, additional working processes are required to produce the entry holes in the upper copper layer by the phototechnical-chemical method.

The second process known in the state of the aft is similar to the first; however, a laser is used which is reflected by the copper and thus does not attack the copper. This permits higher energy densities and thus a somewhat more rapid machining of the polyamide. limits are however set (about 2 J/cm$^2$) on the increase of the energy density, since otherwise the polyimide is thermally damaged and the hole edges are burnt, and then can no longer be metailized. A typical laser for carying out this process is a pulsed $CO_2$ laser.

The disadvantage of this process is that additional working processes are required to produce the entry holes in the upper copper layer by the phototechnical-chemical method. Moreover a polynimde coating about 0.7 $\mu$m thick remains on the lower copper floor.

The third known process according to the state of the art uses different lasers for the removal of the copper layer and of the polyimide. For example, a Nd-YAG laser with high energy density (for example, 20 J/cm$^2$) is used to drill the upper copper layer, and a UV or $CO_2$ laser is used to drill the polyimide.

The disadvantage of this process is that two different lasers are required, and the optics used have to be designed for both wavelengths.

In the fourth process known from the state of the art, the machining of the laminate takes place with a LTV laser in such a manner that the upper copper layer is drilled at a high energy density, and the energy density is then reduced by defocusing the beam or by pivoting a filter in, so that the beam does in fact machine the polynimde but does not attack the copper.

This process also has disadvantages. Since lasers are hardly controllable in their energy output, energy is wasted in the machining of the polyimide. The capacity of the laser consequently cannot be used, which finally means a reduced productivity.

The invention has as its object to provide a material irradiation apparatus which has the highest possible functionality at a minimum technical expense, and to find an energetically favorable process for the use of material irradiation apparatuses.

This object is achieved by a material irradiation apparatus comprising: a beam source for producing a machining beam, a beam splitter positioned following said beam source for dividing said machining beam into a plurality of partial beams, a plurality of deflecting devices each associated with a different one of said partial beams for deflecting said partial beams individually to different places,on at least one workpiece to be machined, independently of other said partial beams, wherein the diameter of said machining beam before said beam splitter is equal to the diameter of a partial beam following said beam splitter, each said beam splitter is movably arranged on an axis of said machining beam incident on said beam splitter, and said partial beams emerging from each said beam splitter are simultaneously incident on a surface of said at least one workpiece.

A process that achieves the object of the invention comprises: dividing said machining bewn into several partial beams by a beam splitter positioned following said beam source, deflecting each partial beam independently of each other partial beam by a deflecting device discretely associated with each partial beam, to different places on at least one work Piece to be machined, and deflecting at least two partial beams, by said deflecting device simultaneously to at least one point on a surface of said workpiece.

The irradiation apparatus according to the invention is distinguished in that it is very simply built and nevertheless has very high flexibility.

SUMMARY OF THE INVENTION

The object of the invention is to provide a material irradiation apparatus that has the highest possible functionality at a minimum technical expense, and to find an energetically favorable process for the use of material irradiation apparatuses.

This object is achieved by the features according to the invention.

Such an apparatus is constructed relatively simply and is ideally suited for connection to a control. Furthermore, very varied kinds of machining can take place simultaneously at a point or on a surface. For example, it would be conceivable to drill a hole by means of one beam, which is very sharply focussed, and to simultaneously heat the surroundings of the drill hole in order to insure a better bonding of the workpiece surface with a conductive material which is sprayed on or placed on (for example, for printed circuit boards).

The number of the partial beams is in principle unlimited; several partial beams can simultaneously fall, parallel to each other, on one place or different places on the workpiece.

Here several similar arrangements can be placed adjacent to each other, so that a whole surface can be singly machined simultaneously at quite different places, or else multiple machining in parallel can take place simultaneously.

The higher the number of partial beams, the higher the power of the beam source has to be. A laser therefore has to be used in most cases as the beam source.

In order to obtain a simple and flexible design of the apparatus, the optical axis from the beam source is as far as possible not to run in one direction with the optical axes of the partial beams.

Beam splitters are suitable for the production of the partial beams which, in particular, allow one partial beam to pass through unaltered and deflect another partial beam. Partially transparent beam splitters (beam splitter cubes) are particularly concerned here. The beam emerging from the beam source should however already receive a suitable beam cross section, and if necessary be adjusted in its divergence, before the beam splitting.

Further advantageous features of the invention are set out in the following description.

The invention is described hereinbelow by means of examples and with reference to drawings, with a description of further important features and also explanations and embodiment possibilities of the inventive concept serving for a better understanding.

BRIEF DESCRIPTION OF THE DRAWINGS

Preferred embodiments of the invention will now be described, taken together with the drawings, in which.

DETAILED DESCRIPTION OF THE PREFERRED EMBODIMENTS

Figure 1:
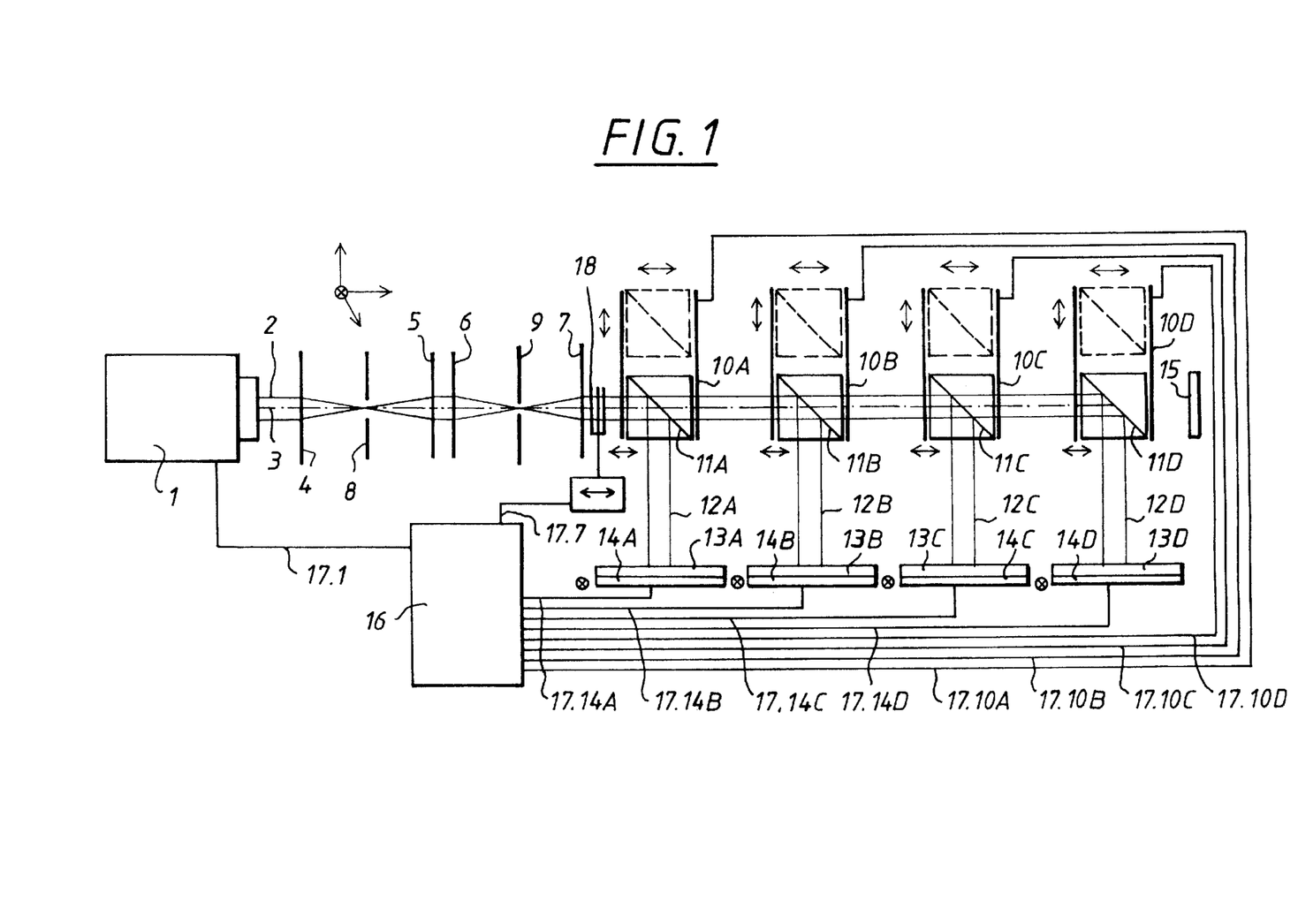
FIG. 1 shows an irradiation apparatus according to the invention.

The irradiation apparatus which is shown by way of example in FIG. 1 has an excimer laser as a beam source (1). However, it could also be any optional pulsed laser or continuous-wave laser (advantageously with a wavelength between 190 and 3000 $\mu$m, but $CO_2$ lasers are also partially of advantage), where according to the wavelength the optical components (lenses, mirrors, and the like) which are specially suitable for this wavelength are to be selected, and which can in particular guide and shape the laser beam.

The machining beam (2) emerging from the beam source (1) has an optical axis (3) on which substantially all the further optical components are arranged.

A first cylindrical lens group (4,5) for a first shaping of the machining beam (2) in one beam cross section axis is located behind the beam source (1). A first slit-shaped divergence filter (8), by means of which the divergence of the machining beam (2) in one beam cross section axis is adjusted, is arranged between the two lenses (4,5).

A second cylindrical lens group (6,7) is located behind this first cylindrical lens group (4,5), in order for a further shaping of the machining beam (2) in an axis perpendicular to the first axis. A second slit-shaped divergence filter (9) is arranged between the two lenses (6,7) in order to adjust the divergence of the machining beam (2) in a beam cross section axis oriented perpendicular to the first axis.

A zoom objective (18) is inserted after the second cylindrical lens component group, in order to vary the beam cross section.

After the machining beam (2) has now attained the desired and predetermined values of both beam cross section and also axial divergence, it is incident on a first beam splitter device (10A) which contains a beam splitter cube (11A) with a beam splitting layer in its interior. The beam splitter device (10A) has, in the region of the optical axis (3), correspondingly large openings through which the machining beam (2) can pass unaltered.

If the beam splitter cube (11A) is located on the optical axis (3), it allows a portion of the machining beam (2) which is incident on it to pass through unaltered. Another machining partial beam (12A) is however coupled by it out of the machining beam (2) as a partial beam, and is incident on a workpiece (13A) to be machined, situated on a conveyor belt (14A).

This conveyor belt (14A) can move the workpiece (13A) perpendicularly to the plane of the drawing. The beam splitter device (10A) can execute a motion parallel to the optical axis (3) and thus perpendicular to the axis of movement of the We conveyor belt (14A), so that the combination of the two motions insures that each region of the surface of the workpiece (13A) can be reached by the machining beam (12A).

The same holds correspondingly for the following beam splitters (10B,10C,10D), beam splitter cubes (11B, 11C, 11D), machining beams (12B, 12C, 12D), and conveyor belts (14B, 14C, 14D). The last beam splitter cube (I1lD) can however have a mirror-coated layer instead of a beam splitter layer.

A beam absorption wall (15) is furthermore arranged behind the last beam splitter device (10D). This beam absorption wall (15) is necessary because all the beam splitter cubes (11A, 11B, 11C, 11D) of the beam splitters (10B, 10C, 10D) are removable out of the optical axis (3) when the corresponding machining partial beam (12A, 12B, 12C, 12D) is not in fact required. (It can of course also be a component of the last beam splitter device (10D), in a modification from what is shown in FIG. 1).

Since the drawing is only to be by way of example, it will be understood that the number of beam splitter devices (10) and of the corresponding other components can be greater or smaller than that shown in the drawing.

The material irradiation apparatus also contains a control (16) which is connected to all the components and assemblies to be controlled (1, 10A, 10B, 10C, 10D, 14A, 14B, 14C, 14D, 18) by means of leads (17.1, 17.7, 17.10A, 17.10B, 17.10C, 17.10D, 17.14A, 17.14B, 17.14C, 17.14D). The control (16) then selectively controls, in particular, the beam source (1), the relative motion of the zoom objective (18), the up and down motion of the beam splitter cubes (11A, 11B, 11C, 11D) in the beam splitter devices (10A, 10B, 10C, 10D), and the forward or backward movement of the conveyor belts (14A, 14B, 14C, 14D).

Figure 2:
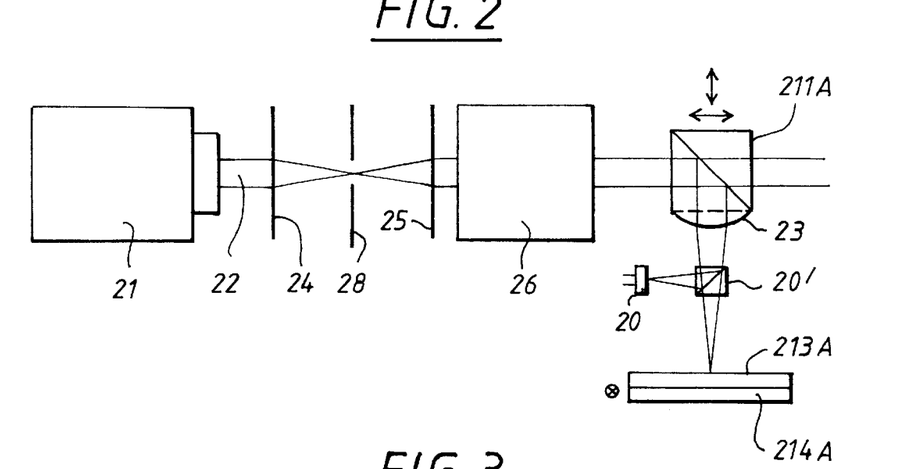
FIG. 2 shows a variant of the irradiation apparatus of FIG. 1.

A slightly modified variant of the material irradiation apparatus shown in FIG. 1 is shown in FIG. 2. As a difference from the apparatus shown in FIG. 1, a beam homogenizer (26) according to the known state of the art is here arranged before the first beam splitter cube (211A), and homogenizes the energy distribution in the cross section of the machining beam (22).

Furthermore a further beam splitter cube (20') is located between the beam splitter cube (211A) and the workpiece (213A), and deflects a small fraction of the partial beam bundle onto a photodiode (20). Tis photodiode (20) measures the intensity of the machining beam bundle, and this measurement result can then be fed to a control (16 in FIG. 1; not shown in this Figure), which uses the measurement value for regulating the power output of the beam source (21).

A further variation relates to the lens assembly (24,25) with the divergence filter (28) integrated into it The lenses of the lens assembly (24,25) are of spherical form here, and the divergence filter (28) is embodied as an apertured diaphragm.

Furthermore the beam splitter cube (211A) has a beam exit surface (23) for the partial beam, to focus the partial beam which emerges from it.

The workpiece movement device (214A) is embodied as a coordinate table which makes possible a movement of the workpiece (213A) at least in an axis perpendicular to the plane of the drawing.

Figure 3:
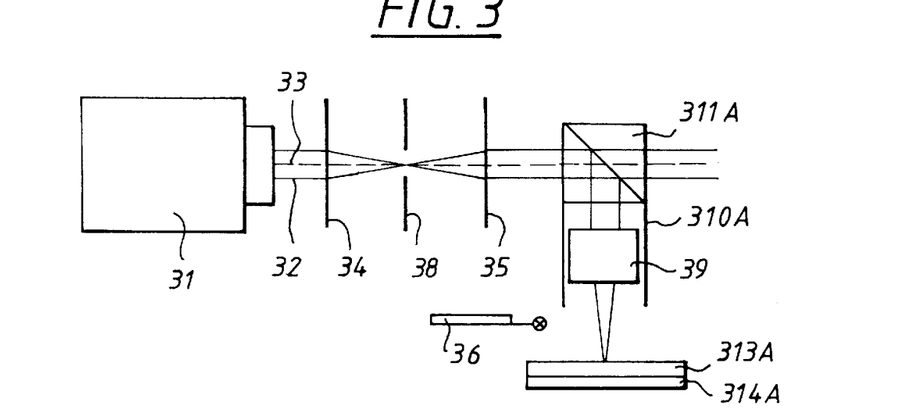
FIG. 3 shows a further variant of the irradiation apparatus of FIG. 1.

In FIG. 3, the rotationally symmetrical lenses of the lens assembly (34, 35) are fixed relative to each other and the divergence filter (38) is embodied as an adjustable diaphragm.

The beam splitter cube (311A) always remains in the optical axis (33) of the machining beam (32). If the partial beam coupled out of the machining beam (32) is to be switched off, a beam absorption wall (36) is pivoted in front of the beam splitter devices (310A) in this variation of the material irradiation apparatus shown in FIG. 3.

A zoom objective (39) is arranged behind the beam splitter cube (311A) and obtains its movement instructions from the control (16 in FIG. 1). The beam absorption wall (36) must be arranged to be able to pivot out after the beam splitter cube (311A) and before or behind the objective (39).

Figure 4:
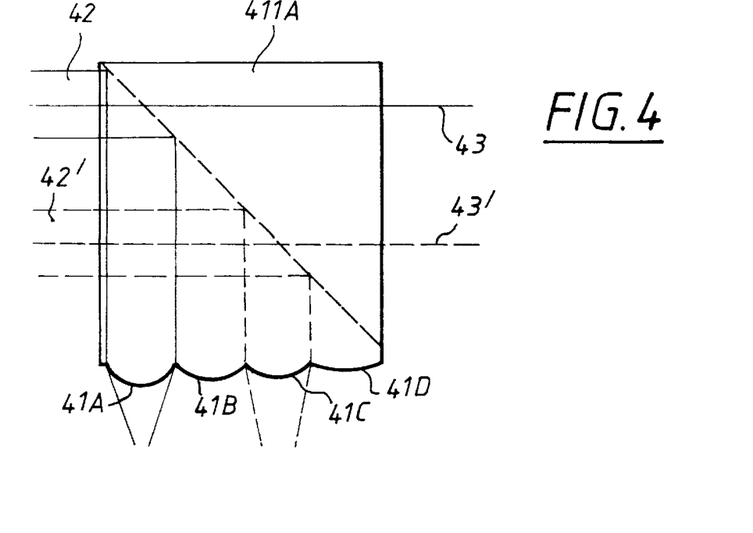
FIG. 4 shows a beam splitter cube, modified according to the invention.

A modified beam splitter cube (411A) is shown in FIG. 4. This beam splitter cube (41 1A) is made larger than necessary, so that the machining beam (42, 42') can leave it at different places. While the machining beam (42, 42') always enters the beam splitter cube (411A) at a plane surface, the exit surface (41A, 41B, 41C, 41D) of the beam splitter cube (411A) is embodied in lens form, in order to focus onto the workpiece surface the partial beam which is irradiated in the direction of the workpiece to be machined (not shown here).

If the machining beam (42) is now incident on the beam splitter cube (411A) in the upper region of the beam splitter layer, the partial beam is focused by the beam exit surface (41A). If on the other hand the machining beam (42) is incident on the beam splitter cube (411A) in the lower region of the beam splitter layer, the partial beam is focused by the beam exit surface (41C). In order to prevent the partial beam irradiating the workpiece surface, one or more beam exit surfaces (41D) can if necessary be formed as a beam absorption wall.

The selection of the respectively desired beam exit surface (41) takes place by raising or lowering the beam splitter cube (411A) relative to the optical axis (43) of the machining beam (42) (according to the embodiment of the beam splitter cube, also by a lateral displacement).

Figure 5:
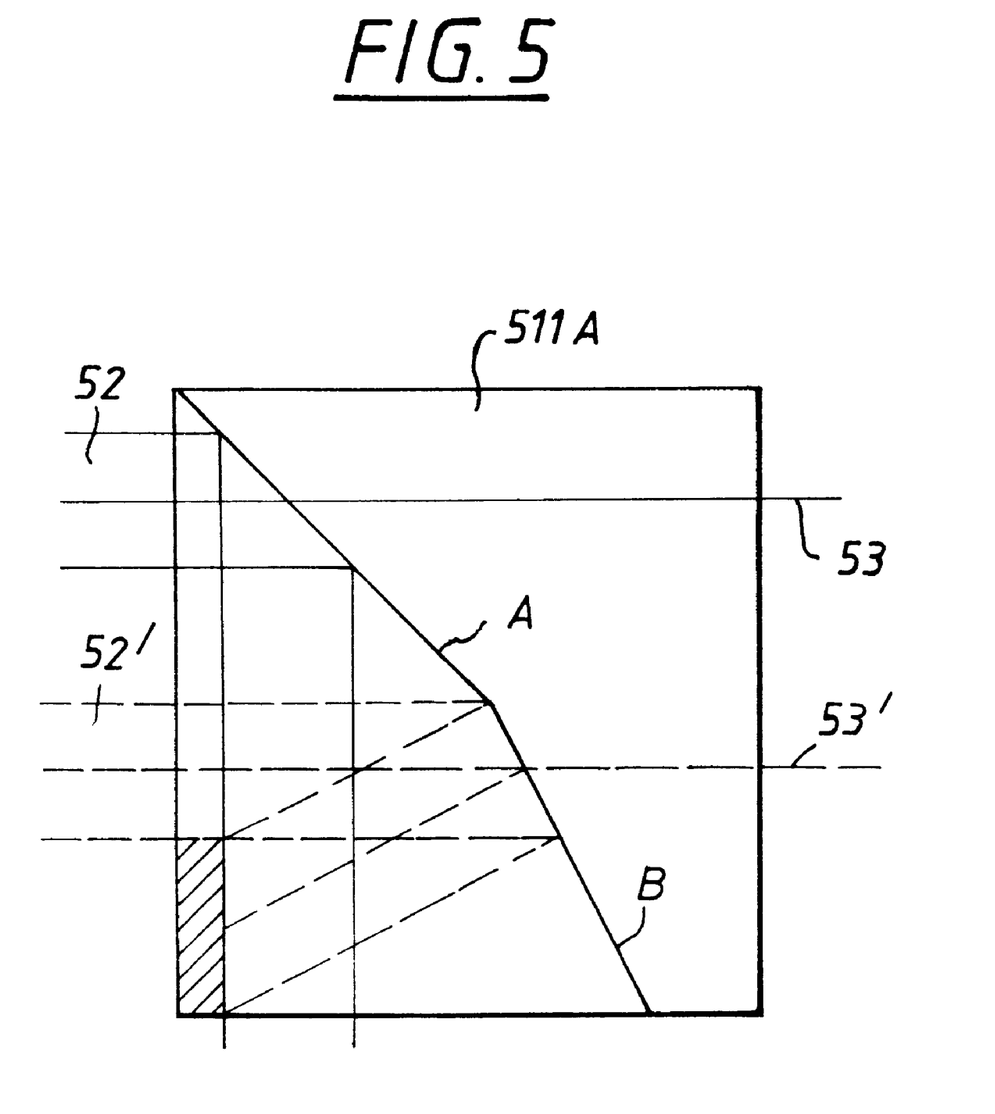
FIG. 5 shows a further variant of a beam splitter cube, modified according to the invention.

A further variant of the beam splitter cube (511A) is shown in FIG. 5. The beam splitter layer is here divided into two sections, A and B.

If the machining beam (52) is incident on the beam splitter cube (511A) in the section A in the upper region of the beam splitter layer, the partial beam through the beam exit surface (41A) will be wholly normal to the workpiece surface (not shown in this Figure). If on the contrary the machining beam is incident on the beam splitter cube (411A) in the section B in the lower region of the beam splitter layer, the partial beam is deflected against a wall of the beam splitter device which is embodied as a beam absorption wall.

A beam splitter cube is not shown which, as in FIG. 4, was made larger than necessary and which has several successively arranged zones with different degrees of coupling-out The different zones can be arranged along the line which is shown dashed in FIG. 4 or FIG. 5, but this entails the disadvantage of a smaller lateral mobility of the beam splitter cube.

Alternatively, the different zones can also be arranged laterally (that is, in the plane of the drawing in FIG. 4), which would necessitate an additional lateral mobility of the beam splitter cube in the beam splitter device.

Equivalent considerations of course also apply to the beam splitter cube (411A) shown in FIG. 4. An illustration of this variant has been dispensed with for the sake of clarity.

Figure 6:
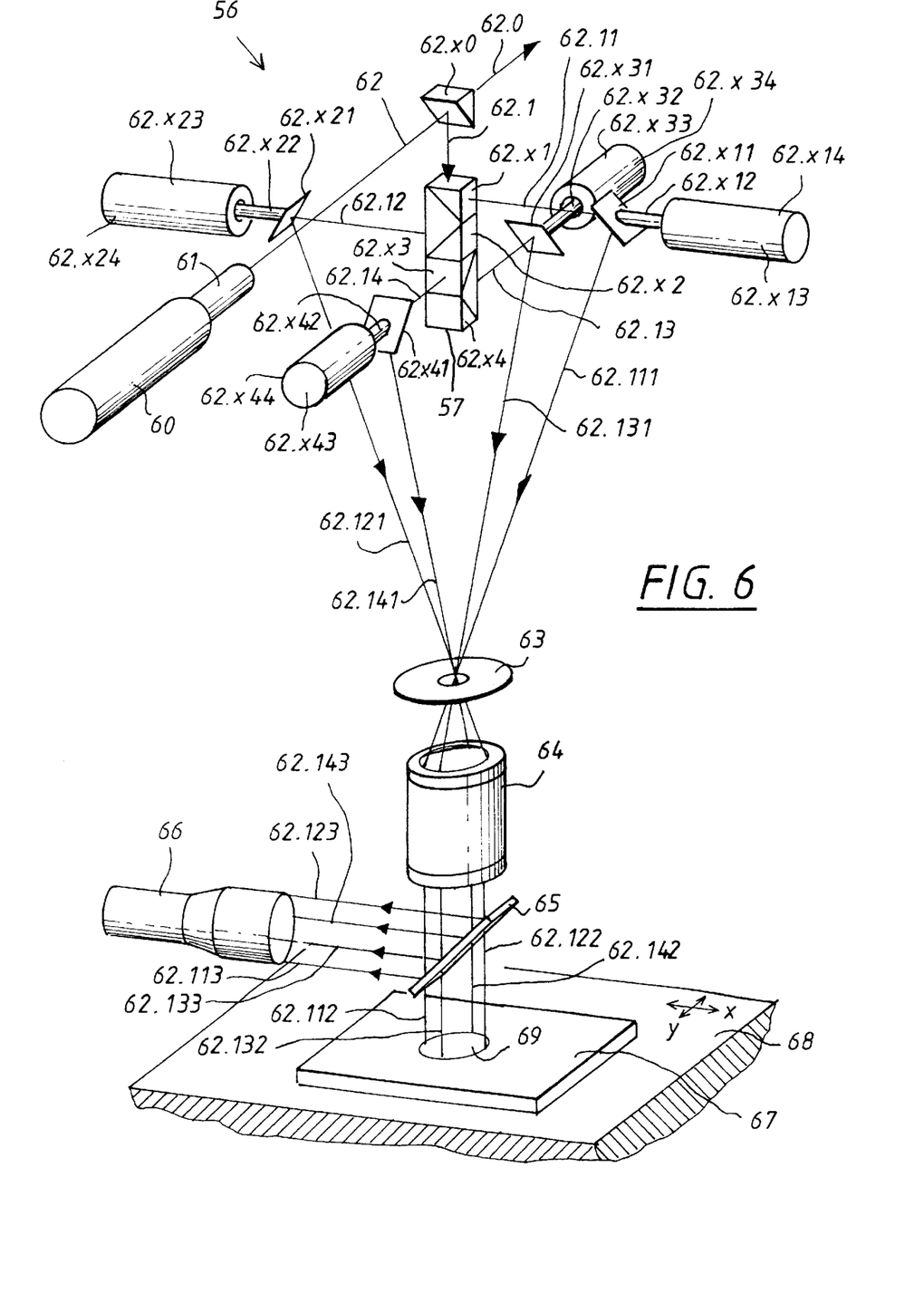
FIG. 6 shows a variant of the irradiation apparatus according to the invention.

The variant shown in FIG. 6 of the irradiation apparatus (56) according to the invention has as essential components a laser (60), one or more partial beam producing devices (62.x.0, 57), beam deflecting devices (62.x14, 62.x24, 62.x34, 62.x44) for each partial beam (62.11, 62.12, 62.13, 62.14), a trap diaphragm (63) and a projection objective (64), and also an observation unit (66). In contrast to the known single beam, multiple single beam, and multi-beam irradiation apparatuses, there is obtained with the irradiation apparatus (56) according to the invention a clearly simpler apparatus which, if necessary without beam homogenization and microlens arrays, operates in multi-beam mode (preferably with four beams) with a constructional volume like that of a single beam machine, and to which furthermore additions can be made at low cost.

The power laser (60) used, which is of a suitable optical quality according to the state of the art, advantageously has a wavelength from 190 $\mu$m up to over 1,000 $\mu$m, and has a mean power of a few mW up to a few watts, according to the purpose for which the irradiation apparatus (56) is to be used.

The laser beam (62) emerging from the laser (60) or from the beam improvement device (61) (see FIG. 10) is incident on a first device (62.x0) which is embodied either as a beam splitter or as a reflector. If this device (62.x0) is embodied as a reflector (when no fuiier beam splitters are provided behind the device (62.x0)), the reflector (62.x0) advantageously has a 45° mirror for a 90° beam deflection.

If the device (62.x0) is embodied as a beam splitter, a laser beam (62.0) passes unaltered through the device (62.x0), to be incident on several further devices corresponding to the device (62.x0). The last of the devices is then to be embodied as a reflector. The beam deflection angle of the devices (62.x0) is advantageously 90°, but can respectively be another angle, according to the design of the apparatus.

However, the intensity of the laser beam is attenuated by the beam splitting at the beam splitter device (62.x0). The degree of attenuation matches the corresponding irradiation apparatus (56) and results from the number of beam splittings of the laser beam (62) in the corresponding irradiation apparatus (56) behind the beam splitting device (62.x0). The laser (60) must be designed here such that each of the partial beams (62.112, 62.122, 62.132, 62.142) of the laser beam (62) still has a sufficiently high intensity at the surface of the workpiece (67) to be machined, to make the machining of the workpiece (67) possible.

The laser beam (62.1) is deflected by the device (62.x0), which is preferably adjustable in one axis, and is incident on a device (57) for the production of partial beams (62.11, 62.12, 62.13, 62.14), which consists, in the example shown here, of four beam splitter cubes (62.x1, 62.x2, 62.x3, 62.x4). The coated surfaces (62.x1', 62.x2', 62.x3') inclined at 45° are designed so that each of the resulting partial beams (62.11, 62.12, 62.13, 62.14) contains the same energy.

Each of the beam splitter cubes (62.x1, 62.x2, 62.x3), which are arrayed in one axis, one behind the other, deflects the partial beam (62.11, 62.12, 62.13) produced by it at an angle of preferably 90° onto a two-axis deflecting mirror (62x.11, 62x.21, 62x.31) of a deflecting device (62x.14, 62x.24, 62x.34), the size of this deflecting mirror preferably being from 0.25 up to 4 cm$^2$. At the end of the device for the production of partial beams is a reflector (62x.4), which deflects the last partial beam (62.14) onto the deflecting mirror (62.x41) of a further 2-axis deflecting device (62.x44), the size of this deflecting mirror (62.x41) also preferably being from 0.25 up to 4 cm$^2$.

The partial beams (62.11, 62.12, 62.13, 62.14) deflected by the beam splitters (62.x1, 62.x2, 62.x3) or by the reflector (62.x4) onto the two-axis deflecting mirrors (62.x11, 62.x12, 62.x13, 62.x14) (where the size of these partial beams (62.11, 62.12, 62.13, 62.14), which remain substantially constant in cross section, is advantageously 0.25-4 cm$^2$) are reflected by these deflecting mirrors (62.x11, 62.x21, 62.x31, 62.x41), and these beams (62.111, 62.121, 62.131, 62.141) are incident, through the hole of the trap diaphragm (63), on the projection objective (64).

The two-axis tilting mirrors (62.x11, 62.x21, 62.x31, 62.x41) have on their back sides a tilting arrangement (62.x12, 62.x22, 62.x32, 62.x42) which is connected to a drive (62.x13, 62.x23, 62.x33, 62.x43) for the tilting arrangement (62.x12, 62.x22, 62.x32, 62.x42).

Figure 8:
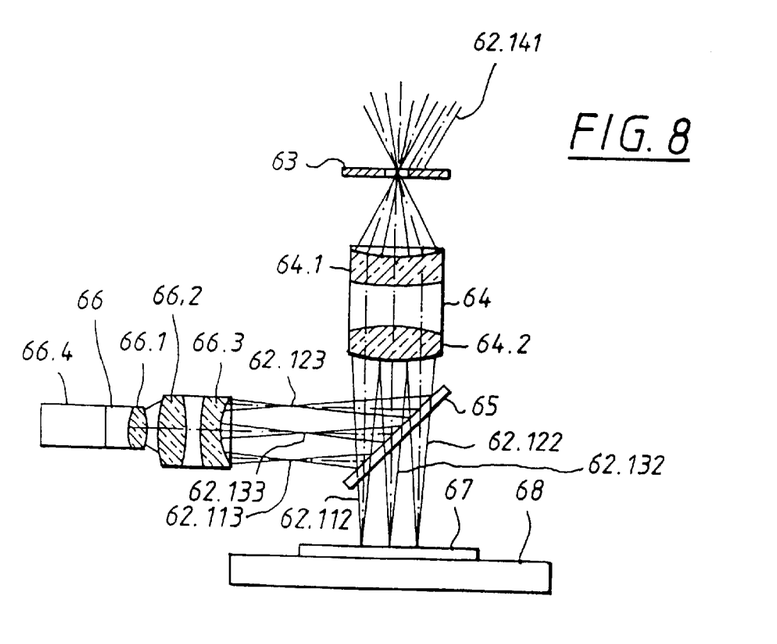
FIG. 8 shows the control device for determining the position of the individual beam of FIG. 6.

The focused beams emerging from the projection objective (64) are incident on a beam splitter (65) which preferably can be moved in and out and which deflects weak partial beams (62.113, 62.123, 62.133, 62.143) in the direction toward an observation unit (66) with an objective and CCD camera to establishing the individual beam position (see also FIG. 8). The partial beams (62.112, 62.122, 62.132, 62.142) passing through the beam splitter (65), or resulting in the absence of the beam splitter (65), reach the surface of a workpiece (67) on a table (68) which is displaceable in at least one axis and the displacement axis of which is preferably oriented at right angles to the adjustment axis of the device (62.x0). The working region (69) of the partial beams (62.112, 62.122, 62.132, 62.142) in one machining step is also shown in FIG. 6.

Figure 9:
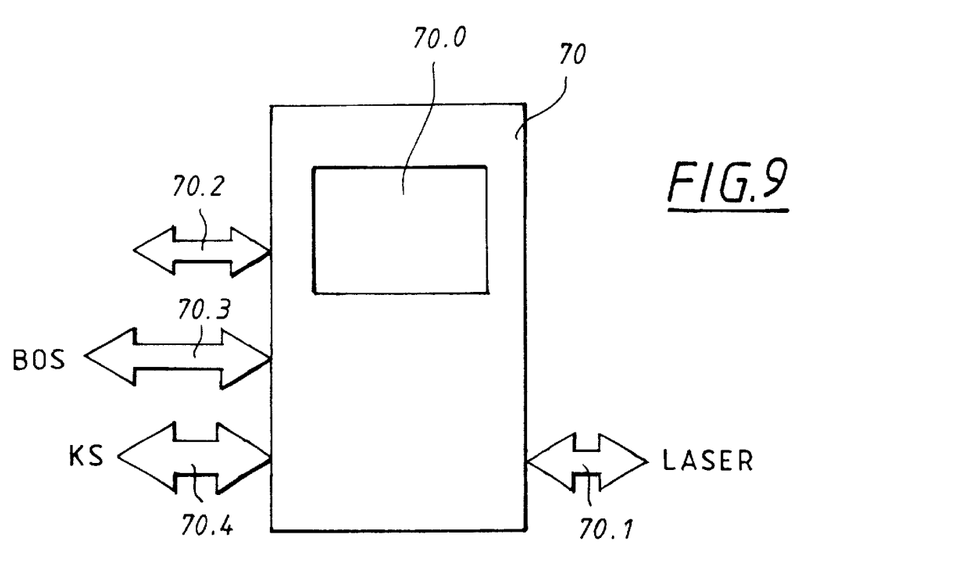
FIG. 9 shows the control for the irradiation apparatus of FIG. 6.

The laser (60), the X-Y table (68), the observation unit (66) and the tilting mirrors (62.x11, 62.x21, 62.x31, 62.x41) are controlled by means of a control (70) (which is shown as such in FIG. 9).

Illustration of the connections between the above-named components and the control, and also of the electrical lines to the individual above-named components, has been dispensed with in these Figures for the sake of clarity. The connections for control and energy transmission are embodied according to the state of the art and can consist, in particular, of wires or wireless connections.

Figure 7:
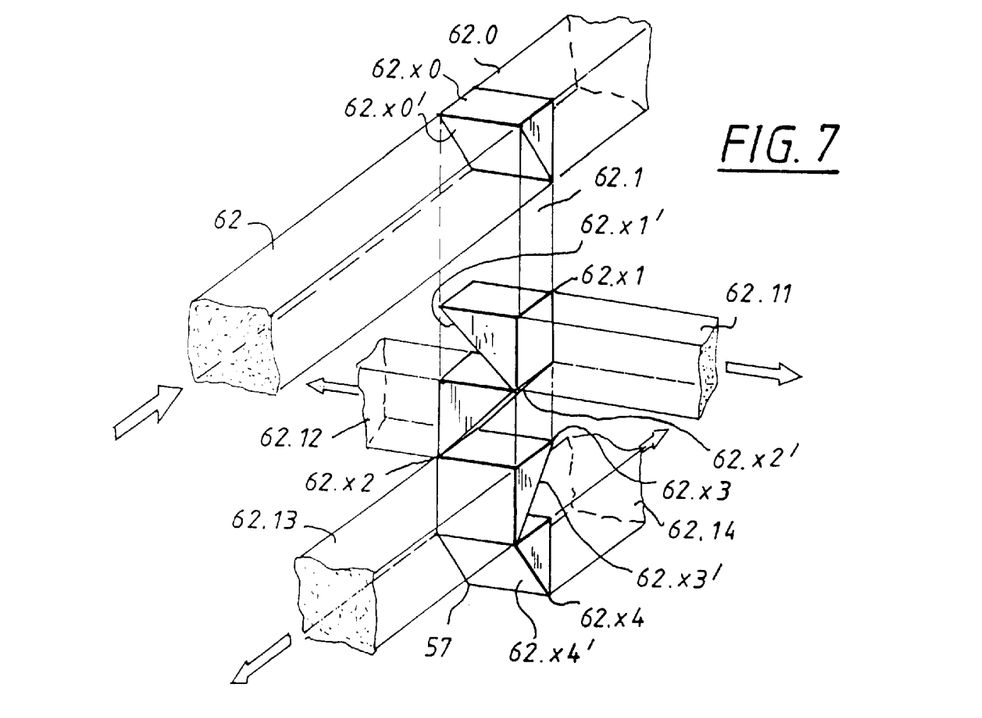
FIG. 7 shows a detail view of the beam splitter in FIG. 6.

The beam guiding of the laser beam (62) coming from the laser (60), or emerging from the beam improvement device (61) to the beam splitters or to the reflector(s) (62x.0, 57), is shown in even greater detail and clarity in FIG. 7.

The first beam splitter device (62.x0) is either a reflector or a beam splitter and is constructed according to the state of the art If the device (62.x0) is a reflector, there is only one partial beam producing device (57).

However, in the normal case several of the partial beam producing devices (62.x0) are arranged one behind the other on the optical axis of the laser beam (62), in order to be able to machine the workpiece (67), or several, possibly different workpieces (not shown in FIGS. 6–10), simultaneously at several places.

These partial beam producing devices (62.x0) can be arranged on one or more arrangement axes, where in the latter case at least one deflecting element (not shown in the Figures) is necessary for the deflection of the laser beam (62.0) when changing from one arrangement axis to another.

The partial beam producing devices (62.x0) are axially displaceable on their arrangement axis, the displacement being effected by the control (70) shown in FIG. 9 or by a further control which is independent of the control (70).

If several partial beam producing devices (62.x0) are arranged one behind the other, the last partial beam producing device should be a reflector, so that no beams emerge uncontrolled or uselessly from the irradiation apparatus (56).

The partial beam producing device (62.x0) shown in FIG. 7 is a beam splitter, the beam splitting layer (62.x0') of which deflects a portion of the laser beam (62) onto the partial beam producing device (57). The portion of the laser beam (62.0) which is not deflected passes through the beam splitter (62.x0) and is incident on one or more beam producing devices (not shown in FIGS. 6 and 10). The energy of the laser beam (62), and also the branching of energy by means of the beam splitter layer (62.x0') of the beam splitter (62.x0), are set such that the partial beams reaching the workpiece (67) can still produce the desired action there.

The laser beam (62.1) deflected by the partial beam producing device (62.x0) is incident on a further partial beam producing device (57) which is constructed from one or more beam splitters (62.x1, 62.x2, 62.x3) and a reflector (62.x4) at its end.

Each of the beam splitters (62.x1, 62.x2, 62.x3) and the reflector (62.x4) at the end of the partial beam producing device (57) respectively produce a partial beam (62.11, 62.12, 62.13, 62.14) at their beam splitting surfaces (62.x1', 62.x2', 62.x3') or reflecting surface (62.x4'). These partial beams (62.11, 62.12, 62.13, 62.14) are then incident on an at least one-axis deflecting device (62.x11, 62.x12, 62.x13, 62.x14, see FIG. 6), which however can also be two-axis (surface motion of the partial beam over the workpiece surface is possible) or three-axis (additional focusing of each partial beam is possible).

The beam splitters (62.x1, 62.x2, 62.x3) and the reflector (62.x4) are arranged such that the partial beams (62.11, 62.12, 62.13, 62.14) produced by them do not leave the partial beam producing device (57) at the same angle. This has the advantage that the deflecting devices (62.x11, 62.x12, 62.x13, 62.x14, see FIG. 6) can be arranged around the partial beam producing device (57), so that a compact apparatus structure is obtained. The angle between the partial beams (62.11, 62.12, 62.13, 62.14) can then be selected specifically for the apparatus and/or in dependence on the number of beam splitters (62.x1, 62.x2, 62.x3) and of the reflector (62.x4).

Since the number of beam splitters is three in the example which has been illustrated by way of example, and a reflector is additionally present, as a result the preferred angle for the four partial beams (62.11, 62.12, 62.13, 62.14) is an angle of 90°.

The optical axes of the partial beams (62.11, 62.12, 62.13, 62.14) produced by the partial beam producing device (57) do not coincide and are slightly displaced in height from each other. The optical axes of the partial beams (62.11, 62.12, 62.13, 62.14) must of course not be perpendicular to the axis of the partial beam producing device (57), but be at any other desired angle to this.

The beam path of the partial beams after the projection objective (64) is shown in further detail in FIG. 8. The observation unit (66) consists of an objective with several optical elements (66.1, 66.2, 66.3) (which are lenses in the example shown here), at the back side of which an image receiving device (66.4) is installed, and in the example shown here is to consist of a CCD camera.

The partial beams (62.111, 62.121, 62.131, 62.141) which are incident on the telecentric objective (64) through the hole of the trap diaphragm (63) are axially parallel. In the example shown in FIG. 8, one of the four partial beams (62.141) is not required, and is deflected by its two-axis tilting mirror (62.x14) onto the surface of the trap diaphragm (63), so that it can no longer develop any effect on the surface of the workpiece (67) which is to be machined. The surface of the trap diaphragm (63) is made radiation absorbing, at least for the laser radiation used, on the side which faces the partial beam producing device (57), and the diaphragm (63) itself is embodied such that it is not damaged, even if all the partial beams (62.111, 62.121, 62.131, 62.141) of the partial beam producing device (57) are incident on it, at least for a certain time.

The projection objective (64) itself can be constructed from one or more optical elements (64.1, 64.2) (they are two lenses, for example, in FIG. 8), and has an optical design according to the state of the art The axially parallel partial beams (62.111, 62.121, 62.131) which are incident through the aperture of the trap diaphragm (63) onto the projection objective (64) are focused by the optics (64.1, 64.2) of the projection objective (64) onto the surface of the workpiece (67) on an X-Y table (68), such that the partial beams (62.112, 62.122, 62.132) are incident there at least substantially perpendicularly to the optical axis of the projection objective (64).

However, if these partial beams (62.112, 62.122, 62.132) are first incident on the beam splitter (65) when this is pivoted in, partial beams (62.113, 62.123, 62.133) are produced which have lower energy and are incident on the observation unit (66). The optical elements (66.1, 66.2, 66.3) of the observation unit (66) itself can be constructed from one or from several optical elements (for example, three lenses in FIG. 8) and has an optical design according to the state of the art An image receiving device (66.4), which is not damaged by the partial laser beams (62.112, 62.122, 62.132) incident on it, is then located behind the optical elements (66.1, 66.2, 66.3), and makes possible an image evaluation of the position of the partial laser beams (62.112, 62.122, 62.132) according to the specific design of the apparatus.

The partial beam producing device (62.x0), together with the beam splitters (62.x1, 62.x2, 62.x3) and the reflector (62.x4), the deflecting devices (62.x11, 62.x12, 62.x13, 62.x14), the trap diaphragm (63), the projection objective (64) and also the observation unit (66) can be combined together as one beam producing unit, since it is moved in common in a displacement on the axis of the partial beam producing device (62.x0), and is advantageously installed in a common housing (not shown in the Figures). The beam producing unit is thus very compact, and several beam producing units can be arrayed one behind the other on a common movement axis, or on different movement axes.

The control (70) shown in FIG. 9 has a data input (70.0) (which can consist, for example, of a connection to a computer, or of a keyboard) and at least four data inputs and outputs (70.1, 70.2, 70.3, 70.4), which lead to the X-Y table (68), the observation unit (66), and the beam producing unit (60). The control can however be additionally used for other purposes which depend on the course of the irradiation by the irradiating apparatus (56) (for example, the movement of the beam producing unit on its axis of movement, which is predetermined by the beam (62)).

Figure 10:
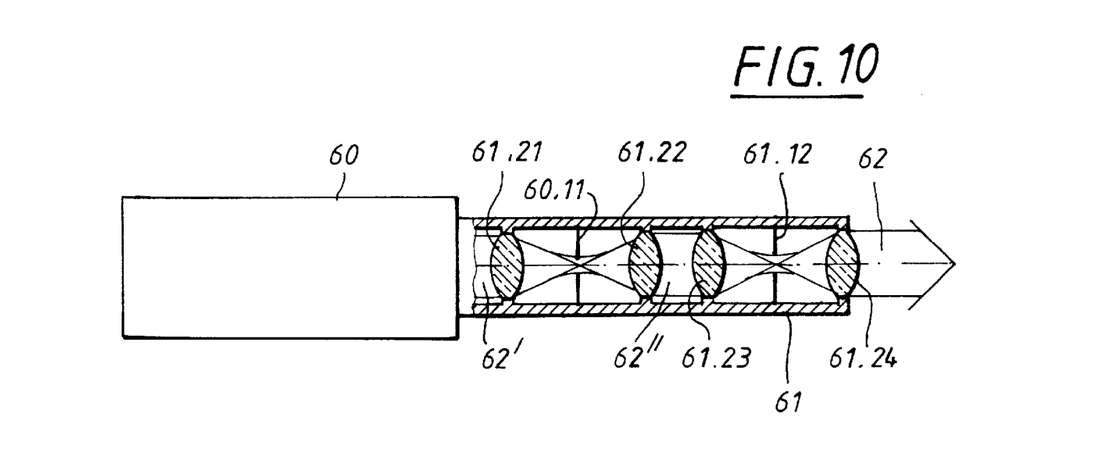
FIG. 10 shows a device for beam improvement for the irradiation apparatus of FIG. 6.

The beam improvement device (61) is shown in fuirther detail in FIG. 10. This beam improvement device (61) is located behind the laser (60) and essentially consists of two diaphragms (61.11, 61.12) and four cylindrical lenses (61.21, 61.22, 62.23, 62.24). A diaphragm (61.11; 61.12) is then arranged between two respective cylindrical lenses (61.21, 61.22; 61.23, 61.24).

The axially parallel laser beam (62') emerging from the laser (60) is focused in one axis by the first cylindrical lens (61.21). The first diaphragm (61.11) is arranged in the focus, and removes the undesired portions of the radiation. The laser beam then widens out again and is incident on the second cylindrical lens (61.22), which is aligned like the first lens, so that a parallel beam path again results behind this second cylindrical lens (61.22) for the laser beam (62") emerging through it By this arrangement (61.21, 61.11, 61.22), the laser beam (62) can also be adjusted in its cross section to the required dimensions in one axis.

The laser beam (62") is now incident on the first cylindrical lens (61.23) of a second arrangement (61.23, 61.12, 61.24) which focuses the laser beam (62") at right angles to the first focusing axis. The second of the diaphragms (61.12) is located in the focus and removes further undesired radiation fractions. The now following cylindrical lens (61.24) then again produces a parallel laser beam (62), which exits the beam improvement device (61). The laser beam (62) can also be adjusted in its cross section to the required dimensions in a further axis by this second arrangement (61.23, 61.12, 61.24), which is aligned perpendicular to the first cross section adjusting axis.

The laser beam (62)thus produced, having passed through the beam improvement device (61), is adjusted in its beam quality and its beam cross section, as required for use in the irradiation apparatus (56).

The measurements of the corrected laser beam are typically 1×1 cm, with up to about 1 watt per partial beam incident on the workpiece. All the beam splitters and reflectors then typically have a size of 1—1—1 cm$^3$, the tilting mirrors have a surface of typically 1×1 cm$^2$, and the constructional length of the deflecting devices (62.x11, 62.x12, 62.x13, 62.x14) amounts to about 5 cm. The objective of the projection objective (64) and also the observation unit (66) then has a diameter of 20-40 mm. The distance between the beam splitters (62.x1, 62.x2, 62.x3) and the reflector (62.x4) and the deflecting devices (62.x11, 62.x12, 62.x13, 62.x14) needs to amount only to about 1 cm, and the distance between the beam splitters (62.x1, 62.x2, 62.x3) and the objective entry lens of the projection objective (64), about 25 cm. However, the measurements can depart to a greater or lesser extent from these data, according to the design of the apparatus.

Basically, the laser processing of metal/plastic laminates as are used, e.g., in the printed circuit board industry, usually requires different energy densities (metals: high energy densities, plastics: low energy densities). Lower energy densities produce no machining in the case of metals, and plastics are thermnally damaged at high energy densities.

This problem can be efficiently solved with several (partial) laser beams which are simultaneously present, are oriented to each other in a geometrically suitable manner, and which are positionable, in that up to 7 individual beams can be guided together in a suitable manner for the production of energy densities in the machining plane of more than 7 J/cm$^2$.

In the machining of laminates consisting of an upper copper layer, a middle polyimide layer, and a lower copper layer, the machining takes place essentially in two steps.

Firstly, a machining of the metal must take place. Several laser (partial) beams are deflected telecentrically onto the same position on the copper at which there is to be a hole. Thus, e.g., from 5 individual beams with respectively 0.7 J/cm$^2$ there results a common laser beam with 3.5 J/cm$^2$, with which a metal machining is possible.

After all the holes in the metal of the upper laminate have been produced in this manner, the next step is the machining of the plastic. The laser beams which had been guided together are now deflected away from each other again, and each individual beam now separately produces a hole in the plastic through the previously created hole in the metal layer. The second metal layer then acts as a stop layer.

When required, the second metal layer can also be drilled through by again deflecting the individual (partial) beams together.

Since in practice the number of the holes to be produced in a workpiece is always clearly larger than the number of the available partial beams (e.g., 1,000,000 holes to 100 or 1,000 partial beams), the individual (partial) beams are always efficiently used for plastic drilling, (and do not have to be stopped down, which finally would be energetically unfavorable and would lead to a longer machining time).

The advantages of this solution according to the invention can be seen to be that:

by the deflection together of the individual laser beams, the machining energy density of the active beam can be accurately dosed as an integer multiple of the machining energy density of the individual beams, and thus the ideal machining energy density can be matched to the respective material which is to be machined;

no laser energy is wasted, and there thus results the highest efficiency of the laser used, and thus a maximum productivity;

in comparison with individual beam processes with one laser with a few watts of output power, powerful lasers with, e.g., 50 W output power can now also be efficiently used;

the disadvantages which have been mentioned of the irradiation apparatuses according to the state of the art are without exception eliminated.

The process according to the invention is energetically very favorable, and permits a very effective use of material irradiation apparatuses, which was not as yet known according to the known state of the art.

I claim:

1. A material irradiation apparatus comprising:
   a beam source (1, 21, 31) for producing a machining beam (2, 22, 32, 42, 52),
   a beam splitter (10A, 10B, 10C, 10D, 310A) positioned following said beam source (1, 21, 31) for dividing said machining beam (2, 32, 42, 52) into a plurality of partial beams (12A, 12B, 12C, 12D),
   a plurality of deflecting devices (11A, 11B, 11C, 11D) each associated with a different one of said partial beams (12A, 12B, 12C, 12D) for deflecting said partial beams individually to different places on at least one workpiece to be machined (13A, 13B, 13C, 13D, 213A, 313A), independently of other said partial beams (12A, 12B, 12C, 12D), and
   at least one workpiece movement device (14A, 14B, 14C, 14D, 214A, 314A) for supporting said at least one workpiece (13A, 13B, 13C, 13D),
   said beam splitter is movably arranged on an axis of said machining beam (2, 22, 32, 42, 52) incident on said beam splitter,
   said partial beams (12A, 12B, 12C, 12D) emerging from each said beam splitter (10A, 10B, 10C, 310A) are simultaneously incident on a surface of said at least one workpiece (13A, 13B, 13C, 13D), and
   said at least one workpiece movement device (14A, 14B, 14C, 14D, 214A, 314A) is arranged to be movable in at least one coordinate direction that deviates from a movement axis of said beam splitter (10A, 10B, 10C, 10D).

2. The material irradiation device according to claim 1, further comprising an optical device (23, 39, 41A, 41B, 41C, 41D) discretely associated with each said partial beam (12A, 12B, 12C, 12D) for focusing each said partial beam (12A, 12B, 12C, 12d).

3. The material irradiation apparatus according to claim 2, wherein each said partial beam (12A, 12B, 12c, 12D) is discretely focused following each beam division.

4. The material irradiation apparatus according to claim 2, wherein said optical device (20', 23, 39, 41A, 41B, 41C, 41D) associated with each said partial beam (12A, 12B, 12C, 12D) is movably coupled to a respective beam splitter (10A, 10B, 10C, 310A).

5. The material irradiation apparatus according to claim 4, wherein said optical device (39) comprises an objective.

6. The material irradiation apparatus according to claim 5, wherein said objective (39) is arranged to change a focus diameter of each said partial beam (12A, 12B, 12C, 12D) on said least one workpiece (13A, 13B, 13C, 13D, 213A, 313A).

7. The material irradiation apparatus according to claim 5, wherein said objective (39) comprises a zoom objective.

8. The material irradiation apparatus according to claim 1, further comprising a control (16) for controlling movement of at least one of said workpiece movement devices (14A, 14B, 14C, 14D, 214A, 314A), said beam splitter (10A, 10B, 10C, 310A), said beam deflecting device, and power of said beam source (1, 21, 31).

9. The material irradiation apparatus according to claim 8, wherein said control (16) is arranged for movement of said opnical device (23, 39, 20', 20; 41A, 41B, 41C, 41D).

10. The material irradiation apparatus according to claim 8, wherein said control (16) is arranged for internal control of said optical device (18, 39, 20', 20; 41A, 41B, 41C, 41D).

11. The material irradiation apparatus according to claim 1, wherein a plurality of said beam splitters (10A, 10B, 10C, 310A) are arranged on one beam axis.

12. The material irradiation apparatus according to claim 11 wherein an axis of movement of each said beam splitter (10A, 10B, 10C, 310A) is perpendicular to a main axis of movement of each said at least one workpiece movement device (14A, 14B, 14C, 14D, 14A, 314A).

13. The material irradiation apparatus according to claim 1, wherein said beam source (1, 21, 31) comprises a laser for producing a laser beam.

14. The material irradiation apparatus according to claim 1, wherein each said partial beam (12A, 12B, 12C, 12D) has an optical axis that deviates from an optical axis (3, 33, 42, 42', 52, 52') incident on said beam splitter (10A, 10B, 10C, 310A).

15. The material irradiation apparatus according to claim 1, wherein said beam splitter (10A, 10B, 10C, 310A) comprises at least one partially transparent beam splitter (11A, 11B, 11C, 211A, 311A, 411A, 511A).

16. The material irradiation apparatus according to claim 1 further comprising beam cross-section adjusting optics (4, 5; 6, 7; 18; 24, 25; 34, 35) arranged following said beam source (1, 21, 31) and before each said beam splitter (10A, 10B, 10C, 310A).

17. The material irradiation apparatus according to claim 16, further comprising a divergence filter (8, 9, 28, 38) arranged in said beam cross-section adjusting optics (4, 5; 6, 7; 24, 25; 34, 35).

18. The material irradiation apparatus according to claim 17, further comprising a control (16) for controlling said divergence falter (8, 9, 28, 38).

19. The material irradiation apparatus according to claim 1 further comprising a beam stopping-down device (36, 41B, 41D) arranged in or following said beam splitter (10A, 10B, 10C, 310A).

20. The material irradiation apparatus according to claim 1 wherein said at least one workpiece (13A, 13B, 13C, 13D, 213A, 313A) comprises a printed circuit board.

21. The material irradiation apparatus according to claim 1, wherein said beam source (1, 21, 31, 60) comprises a pulsed or continuous wave laser.

22. The material irradiation apparatus according to claim 21, wherein said laser has a wavelength between 190 and 3,000 $\mu$m.

23. The material irradiation apparatus according to claim 21, wherein said beam source (1, 21, 31, 60) comprises an excimer laser.

24. The material irradiation apparatus according to claim 21, wherein said radiation source (1, 21, 31, 50) comprises a frequency tripled or frequency quadrupled neodymium-YAG laser.

25. The material irradiation apparatus according to claim 1, wherein said radiation source (1, 21, 31, 60) comprises a $CO_2$ laser and optical components of said material irradiation source are comprised of materials that are suitable for a wavelength of said $CO_2$ laser.

26. The material irradiation apparatus according to claim wherein the diameter of said machining beam before said beam splitter (10A, 10B, 10C, 310A) is equal to the diameter of a partial beam following said beam splitter (10A, 10B, 10C, 10D, 310A).

27. The material irradiation apparatus according to claim 1, wherein said machining beam (2, 22, 32, 42, 52) is successively incident on a plurality of beam splitters (10A, 10B, 10C, 211A, 311A).

28. Process for operation of a material irradiation apparatus (56) having a beam source (60) that produces a machining beam (62), comprising:

dividing said machining beam (62. 1) into several partial beams (62-11, 62.12, 62.13, 62.14) by a beam splitter (62.x0, 57) positioned following said beam source (60), in one of two steps deflecting each partial beam (62.11, 62.12, 62.13, 62.14) independently of each other partial beam by a deflecting device (62.x11, 62.x12, 62.13, 62.x14) discretely associated with each partial beam, to different places on at least one workpiece to be machined (67), situated on a workpiece movement device (68) that is movable in at least one axis, and in the other of two steps deflecting at least two partial beams (62.11, 62.12, 62.13, 62.14) by said deflecting devices simultaneously to at least one common point, wherein said at least one common point of all said partial beams (62.11, 62.12, 62.13, 62.14) that are to be united is part of a working area (69) on said surface of said workpiece,(67).

29. Process according to claim 28, comprising deflecting at least four partial beams simultaneously to at least one point on surface of said workpiece (67).

30. Process according to claim 28, wherein said at least one point on said surface of said workpiece (67) lies in a flat working region (69) of all said partial beams (62.11, 62.12, 62.13, 62.14) that are to be united.

31. A material irradiation apparatus comprising:

a beam source (1, 21, 31) for producing a machining beam (2, 22,32, 42, 52), a beam splitter (10A, 10B, 10C, 10D, 310A) positioned following said beam source (1, 21, 31) for dividing said machining beam (2, 32, 42, 52) into a plurality of partial beams (12A, 12B, 12C, 12D), and a plurality of deflecting devices (11A, 11B, 11C, 11D) each associated with a different one of said partial beams for deflecting said partial beams individually to different places on at least one workpiece to be machined (13A, 13B, 13C, 13D, 213A, 313A), independently of other said partial beams, wherein the diameter of said machining beam before said beam splitter (10A, 10B, 10C, 10D, 310A), is equal to the diameter of a partial beam following said beam splitter (10A, 10B, 10C, 10D, 310A), said beam splitter is movably arranged on an axis of said machining beam (2, 22, 32, 42, 52) incident on said beam splitter, and said partial beams emerging from each said beam splitter (10A, 10B, 10C, 310A) are simultaneously incident on a surface of said at least one workpiece.

32. A material irradiation apparatus according to claim 31, wherein said beam splitter is movable at least in a direction of said axis of said machining beam (2, 22, 32,42, 52) incident on said beam splitter.

33. Process for operation of a material irradiation apparatus (56) having a beam source (60) that produces a machining beam (62), comprising:

dividing said machining beam (62.1) into several partial beams (62.11, 62.12, 62.13, 62.14) by a beam splitter (62.x0, 57) positioned following said beam source (60), in one of two steps providing a deflecting device discretely associated with each of said partial beams for deflecting each partial beam independently of each other partial beam to different places on at least one workpiece to be machined, and in the other of two steps controlling said deflecting device so that at least two partial beams are simultaneously deflected to a common point on said surface of said workpiece.

* * * * *